United States Patent [19]

Kimoto et al.

[11] Patent Number: 5,097,134
[45] Date of Patent: Mar. 17, 1992

[54] SCANNING ELECTRON MICROSCOPE

[75] Inventors: Masahiko Kimoto, Akigawa; Kenichi Ishihara, Tachikawa, both of Japan

[73] Assignee: JEOL Technics Ltd., Tokyo, Japan

[21] Appl. No.: 616,413

[22] Filed: Nov. 21, 1990

[30] Foreign Application Priority Data

Nov. 24, 1991 [JP] Japan ................. 1-305942

[51] Int. Cl.⁵ .......................................... G01N 25/00
[52] U.S. Cl. ..................................................... 250/443.1
[58] Field of Search ................. 250/310, 441.1, 443.1

[56] References Cited

U.S. PATENT DOCUMENTS 4,071,766 1/1978 Kalmon et al. ............... 250/443.1
4,705,949 11/1987 Grimes et al. ............... 250/441.1
4,720,663 1/1988 Nelson ........................ 250/310

Primary Examiner—Bruce C. Anderson
Attorney, Agent, or Firm—Webb, Burden, Ziesenheim & Webb

[57] ABSTRACT

A scanning electron microscope permitting observation of raw biological specimens containing moisture. A vessel accommodating water supplied to the specimen is formed. A passage is formed in the specimen chamber of the microscope to convey the liquid from the vessel to the specimen. A pipe for introducing a gas such as air is connected with the passage. The introduced gas leaks around the specimen after flowing through the passage to prevent the liquid from freezing in the vessel and in the passage when the specimen chamber is evacuated to a vacuum.

6 Claims, 2 Drawing Sheets

SCANNING ELECTRON MICROSCOPE

FIELD OF THE INVENTION

The present invention relates to an electron microscope and, more particularly, to a scanning electron microscope which permits raw specimens containing moisture to be observed without drying them.

BACKGROUND OF THE INVENTION

Observation of biological specimens using scanning electron microscopes is widespread. In order to observe a specimen containing moisture such as a biological specimen, it must be pretreated, i.e., it is fixed, dehydrated, and dried. However, the pretreatment brings about changes in the state of the specimen. For example, it contracts or deforms. Therefore, it is impossible to observe the raw specimen.

U.S. Pat. No. 4,720,633 discloses a technique for observing specimens after pretreating them as little as possible. In this technique, a specimen is observed while maintaining the specimen chamber at a low vacuum.

In this kind of scanning electron microscope, the specimen chamber and the body of the microscope are differentially pumped. A specimen is observed while keeping the inside of the specimen chamber at a relatively low pressure, for example, a fraction of a Torr.

At such a low pressure, the moisture of the specimen is immediately frozen, and the specimen gradually dries. In this way, changes in the state of the specimen such as contraction and deformation cannot be completely prevented. Hence, it has been heretofore impossible to observe raw specimens containing moisture.

SUMMARY OF THE INVENTION

It is an object of the invention to provide a scanning electron microscope which enables observation of raw specimens containing moisture.

It is another object of the invention to provide a scanning electron microscope which enables observation of nonconducting specimens without the need to make them electrically conductive.

It is a further object of the invention to provide a scanning electron microscope having a simple and compact device for constantly replenishing water lost from specimens.

The present inventors have discovered that (1) drying of a raw specimen during observation can be suppressed by replenishing water and (2) gas, such as air, can be constantly supplied to prevent a passage for conveying replenishing water to the specimen from becoming frozen when the specimen chamber is evacuated to a vacuum.

The present invention has been made based on these findings. The above objects are achieved by a scanning electron microscope comprising: a vessel containing a liquid supplied to a specimen; a passage mounted inside the specimen chamber of the microscope for conveying the liquid from the vessel to the specimen; and a means for introducing a gas to prevent the liquid from becoming frozen in the vessel and in the passage when the specimen chamber is evacuated to a vacuum.

In one embodiment of the invention, the vacuum chamber accommodates an electron gun and an electron optical system, and the vacuum chamber is evacuated to a high vacuum. The specimen chamber is partitioned from the vacuum chamber by a plate having an orifice passing the electron beam such that these two chambers are differentially pumped. A pipe for introducing the gas is connected with the passage. The introduced gas flows through the passage and leaks out around the specimen.

Preferably, the vessel and the passage are formed in a specimen mount. The liquid is conveyed from the vessel to the specimen via a capillary tube, such as a thread or a hollow thread, extending though the passage.

During evacuation of the specimen chamber, the gas such as air is admitted into the vessel and into the passage to prevent the liquid from freezing in the vessel and in the passage. If the specimen is a biological specimen containing moisture, then the liquid, such as water, stored in the vessel is continuously supplied to the specimen through the passage during observation of the specimen. Consequently, the specimen is prevented from drying, which in turn prevents changes in the state of the specimen such as contraction and deformation.

DETAILED DESCRIPTION OF THE INVENTION

Figure 1:
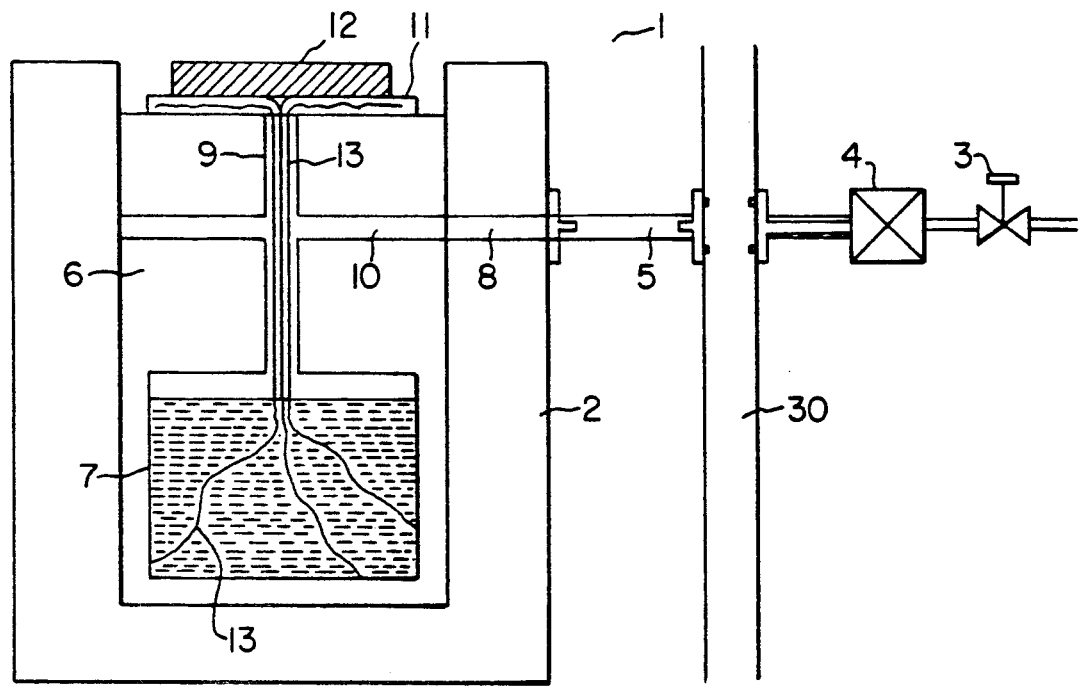
FIG. 1 is a schematic diagram of a specimen-holding device used in a scanning electron microscope according to the invention.

Referring to FIG. 1, main portions of a specimen-holding device used in a scanning electron microscope according to the invention are shown. The microscope includes a specimen chamber 1 the inside of which is maintained as a vacuum. A specimen stage (not shown) is disposed in the chamber 1. A specimen holder 2 is placed on the specimen stage. The wall of the microscope column is indicated by 30. A gas, such as air, nitrogen, carbon dioxide, argon, or helium, is introduced into the specimen holder 2 from outside the microscope column wall 30, i.e., from the atmosphere, via a variable leak valve 3, a solenoid valve 4, and a tube 5. The amount of the introduced gas is adjusted with the valve 3. A specimen mount 6 is disposed inside the holder 2. A water vessel 7 is mounted under the specimen mount 6. A specimen 12 containing moisture such as a biological specimen is bonded to the upper surface of the specimen mount 6 via adhesive 11. A liquid such as physiological salt solution is contained in the vessel 7. A passage 9 is formed to guide the liquid from the vessel 7 to the specimen 12. A capillary tube 13 is formed inside the passage 9 by a thread or a hollow thread. The specimen holder 2 has a gas introduction port 8 which is connected with the passage 9 via a passage 10.

As the specimen chamber 1 is evacuated to a vacuum, the liquid would normally freeze gradually. The gas is introduced into the vessel 7 and into the passage 9 via the passage 10 at a pressure sufficiently high (tens of Torr) to prevent the liquid from freezing in the vessel 7 and in the capillary tube 13. Thus, the liquid contained in the vessel 7 is constantly supplied to the specimen 12 via the capillary tube 13. Because the specimen 12 keeps absorbing the liquid, the specimen is prevented from drying.

The gas admitted into the specimen chamber 1 is guided to the vicinity of the adhesive 11 via the passage 9. As a result, the pressure in the vicinity of the specimen 12 is maintained at 0.1 to 1 Torr. Under this condition, if electric charges are created on the surface of the specimen 1 by bombarding the specimen 12 with the electron beam, the specimen 12 is not charged up, because the molecules of the gas remaining around the electron beam are ionized by the beam, and because the resulting ions neutralize the electric charges. Therefore, where a nonconducting specimen is observed, it is not necessary to deposit gold or carbon to make the specimen electrically conductive.

The specimen mount 6 may be made of a metal. Where the instrument is employed as a low vacuum scanning electron microscope, the specimen mount 6 is preferably made of a material having a low thermal conductivity such as fluorocarbon, acrylic resin, or ceramic. Where the specimen mount 6 is fabricated from a metal, drying of the specimen is promoted because of its good thermal conduction. Where the mount is made of a material having a low thermal conductivity, drying of the specimen is suppressed.

Figure 2:
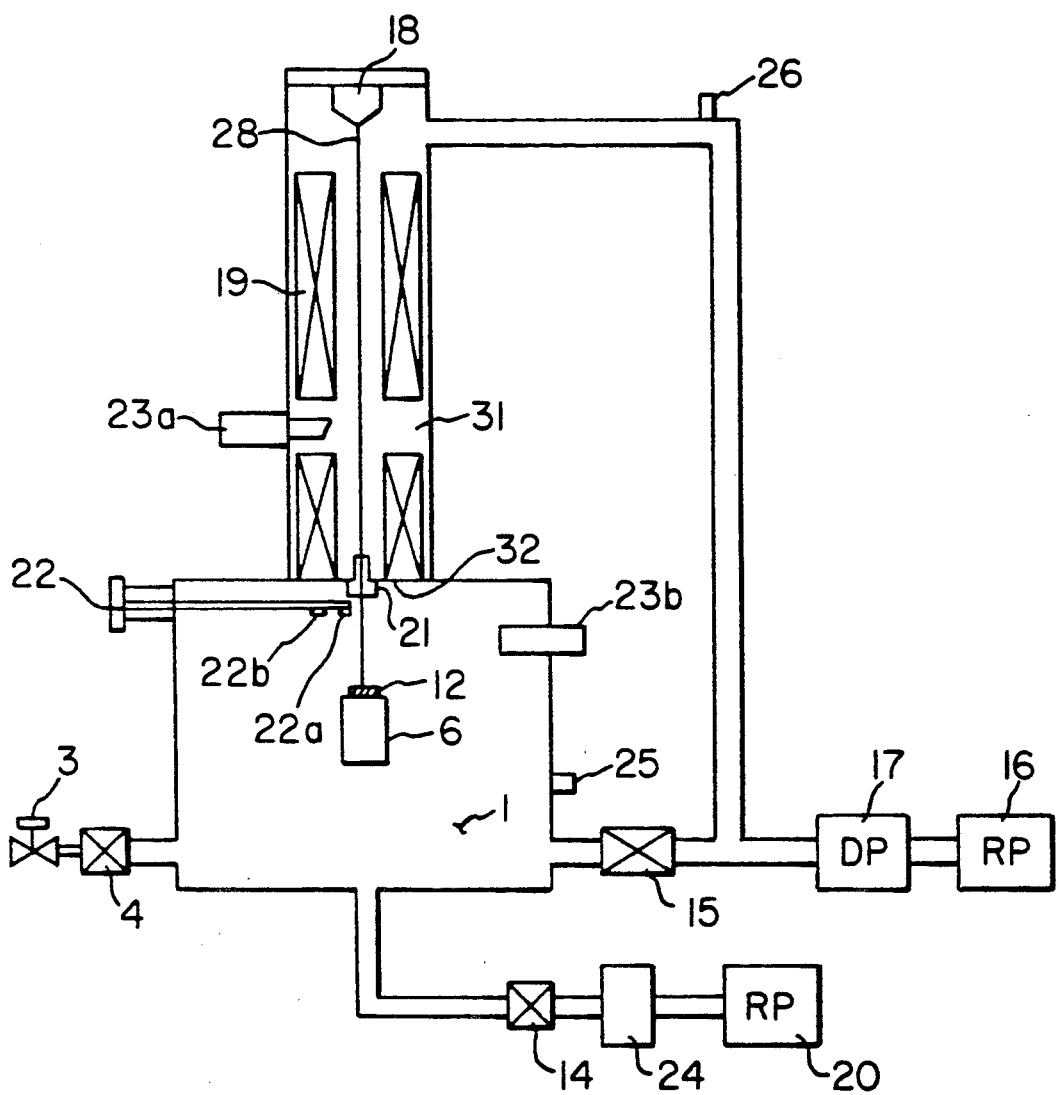
FIG. 2 is a schematic block diagram of the electron microscope using the specimen-holding device shown in FIG. 1.

Referring next to FIG. 2, the whole structure of the scanning electron microscope incorporating the specimen-holding device constructed as described above is shown. The instrument can operate either in a high vacuum mode in which the specimen chamber 1 is evacuated to a high vacuum in the same way as in an ordinary scanning electron microscope or in a low vacuum mode in which the specimen chamber is evacuated to a low vacuum. The pumping system for evacuating the chamber to a low vacuum consists of a rotary pump 20. The pumping system for evacuating the specimen to a high vacuum consists of a rotary pump 16 and an oil diffusion pump 17. When the operation mode is switched to the other mode, solenoid valves 14 and 15 are actuated, as well as the aforementioned solenoid valve 4. The valve 14 is located in the passage extending from the rotary pump 20 to the specimen chamber 1. The valve 15 is installed in the passage extending from the oil diffusion pump 17 to the specimen chamber 1. A rod 22 is inserted in the specimen chamber 1. A pair of detectors 22a and 22b for detecting backscattered electrons is held at the front end of the rod 22. An electron gun 18 and an electron optical system 19 are accommodated in a vacuum chamber 31. A first secondary electron detector 23a is disposed in the vacuum chamber 31, while a second secondary electron detector 23b is positioned in the specimen chamber 1. A foreline trap 24 consisting of activated carbon is mounted between the rotary pump 20 and the solenoid valve 14 to adsorb oil mist going back into the specimen chamber 1 from the pump 20. A Pirani gauge 25 is attached to the specimen chamber 1 to measure the pressure inside the chamber 1. Another Pirani gauge 26 is mounted on the passage extending from the oil diffusion pump 17 to the top of the vacuum chamber 31 to measure the pressure inside the vacuum chamber 31 accommodating the electron gun 18 and the electron optical system 19.

Figure 3:
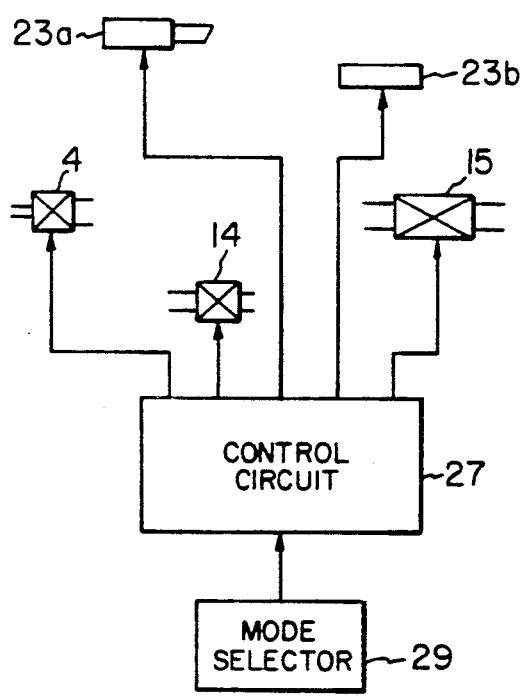
FIG. 3 is a block diagram of a control system providing control of the microscope shown in FIG. 2.

Referring next to FIG. 3, there is shown a control system providing control of the instrument shown in FIG. 2. The control system includes a control circuit 27 controlling the operation of the solenoid valves 4, 14, 15 described above. The operation of the secondary electron detectors 23a and 23b is also controlled by the control circuit 27. The control circuit 27 controls the operation of these components according to the output signal from a mode selector 29 connected with the control circuit 27. A vacuum chamber 31 is partitioned from the specimen chamber 1 by a plate 32 having an orifice 21 passing the electron beam, as shown in FIG. 2.

When the instrument is operated in the high vacuum mode, the mode selector 29 instructs the control circuit 27 to establish the high vacuum mode. Then, the control circuit 27 sends control signals to the solenoid valves to close the solenoid valves 4 and 14 and to open the solenoid valve 15. The vacuum chamber 31 and the specimen chamber 1 are evacuated to a high vacuum by both rotary pump 16 and oil diffusion pump 17.

Under this condition, the signal from the backscattered electron detectors 22a and 22b or the output signal from either secondary electron detector 23a or 23b is supplied to a CRT (not shown) to display an ordinary magnified image of the specimen, in the same way as in a normal scanning electron microscope.

When specimen containing moisture is observed, the mode selector 29 is operated to select the low vacuum mode. Then, the control circuit 27 closes the solenoid valve 15 so that the vacuum chamber 31 may be evacuated by both rotary pump 16 and oil diffusion pump 17. At the same time, the control circuit 27 opens the solenoid valve 14 in such a way that the specimen chamber 1 is mainly evacuated by the rotary pump 20. Furthermore, the control circuit 27 opens the solenoid valve 4 to introduce the gas into the passage 10 inside the specimen chamber 1. As a result, the specimen chamber 1 communicates only through the orifice 21 with the vacuum chamber 31 that is evacuated to a high vacuum. In consequence, the specimen chamber 1 is maintained at a low vacuum which can be adjusted with the variable leak valve 3.

The control circuit 27 supplies a control signal to the second secondary electron detector 23b located inside the specimen chamber 1 to stop the detector 23b from operating. Concurrently, the control circuit 27 operates the first secondary electron detector 23a.

Under this condition, the electron beam 28 emitted from the electron gun 18 is focused onto the specimen 12 and scanned across the surface of the specimen in two dimensions by the electron optical system 19. As a result, secondary electrons and backscattered electrons are produced from the surface of the specimen 12.

When it is desired to obtain a backscattered electron image of the specimen, either the sum of the output signals from the backscattered electron detectors 22a and 22b or the difference between these two signals is fed to the CRT, for giving rise to a compositional or topographic image of the specimen.

When it is desired to observe a secondary electron image of the specimen, the output signal from the first secondary electron detector 23a is fed to the CRT to produce the secondary electron image.

While there has been described a preferred form of the invention, obviously modifications and variations are possible in light of the above teachings. For instance, the tube 5 can be made of a flexible tube to move the specimen 12 during observation of the specimen 12 in the low vacuum mode.

In accordance with the present invention, a liquid such as water can be supplied to the specimen containing moisture such as a biological specimen even during observation of the specimen. Therefore, drying, hence changes in the state, such as contraction and deformation, of the specimen can be prevented during the observation.

Since the specimen chamber and the vicinity of the specimen are kept at a low vacuum, say about 0.1 to 1 Torr, if the specimen is irradiated with the electron beam to produce electric charges on the surface of the specimen, the molecules of the gas remaining around the electron beam are ionized. The resulting ions neutralize the electric charges on the surface of the specimen. Hence, the specimen can be easily observed without the necessity of coating the specimen with gold or carbon even if the specimen is nonconducting.

High voltages must be applied to the electrodes of the secondary electron detectors in use so that they may attract secondary electrons. If low voltages are impressed on the electrodes in a low vacuum, then an electric discharge will take place. However, the novel scanning electron microscope is equipped with a control means which, whenever the low vacuum mode is selected, automatically stops the operation of the secondary electron detector installed in the specimen chamber. Thus, if any malfunction should occur, the aforementioned electric discharge can be prevented.

Also, in the novel scanning electron microscope, the liquid is conveyed from the vessel to the specimen by the capillary tube disposed in the passage. Hence, the specimen can be effectively replenished with the liquid, though the structure is simple.

Furthermore, external heat is not readily transferred to the specimen, because the specimen mount is made of a material having a low thermal conductivity. This also helps prevent the specimen from drying.

Having thus described our invention with the detail and particularity required by the Patent Laws, what is claimed and desired to be protected by Letters Patent is set forth in the following claims.

What is claimed is:

1. A scanning electron microscope for observing moist specimens comprising:
   an electron gun and an electron optical system are mounted in a vacuum chamber which is evacuated to a high vacuum;
   a specimen chamber enclosing a specimen stage on which the specimen may be mounted;
   a vessel accommodating a liquid to be supplied to a specimen;
   a structure defining a passage disposed in a specimen chamber;
   a capillary tube disposed in the passage to convey the liquid from the vessel to the specimen by capillary action; and
   a means for introducing a gas into the passage to prevent the liquid from freezing in the passage when the specimen chamber is evacuated to a vacuum of 0.1 to 1Torr.

2. The scanning electron microscope of claim 1, wherein said specimen chamber is partitioned from the vacuum chamber by a plate having an orifice for passing the electron beam emitted from the electron gun such that the specimen chamber and the vacuum chamber are differentially pumped.

3. The scanning electron microscope according to claim 2, wherein the means for introducing gas comprises a pipe in communication with said passage and said passage opening to the specimen chamber such that gas leaks out around the specimen after flowing through the passage.

4. The scanning electron microscope of claim 1, wherein a secondary electron detector is installed in the specimen chamber; evacuating means are provided such that the microscope can be operated either in a high vacuum mode in which the specimen chamber is evacuated to a high vacuum for observation of an image or in a low vacuum mode in which the specimen chamber is evacuated to a low vacuum for observation of an image; and control means are provided which automatically stop the operation of the secondary electron detector whenever the low vacuum mode is selected.

5. The scanning electron microscope of claim 1, wherein the structure defining said vessel and said passage comprises a specimen mount.

6. The scanning electron microscope of claim 5, wherein said specimen mount is made of a nonmetallic material whereby it has a low thermal conductivity.

* * * * *

UNITED STATES PATENT AND TRADEMARK OFFICE
CERTIFICATE OF CORRECTION

PATENT NO. : 5,097,134
DATED : March 17, 1992
INVENTOR(S) : Masahiko Kimoto and Kenichi Ishihara It is certified that error appears in the above-identified patent and that said Letters Patent is hereby corrected as shown below:

Title page, under [30] Foreign Application Priority Data "Nov. 24, 1991 [JP] Japan ... 1-305942" should read --Nov. 24, 1989 [JP] Japan ... 1-305942--.

Abstract Line 7 after "leaks" insert --out--.

Column 2 Line 8 "though" should read --through--.

Column 3 Lines 40-41
   "to the
    specimen" delete new paragraph; should be one continuous sentence.

Column 4 Line 19 after "When" insert --a--.

Column 4 Line 24 ":time" should read --time--.

Claim 1 Line 13 Column 6 "1Torr" should read --1 Torr--.

Signed and Sealed this

Twenty-second Day of June, 1993

Attest:

MICHAEL K. KIRK

Attesting Officer

Acting Commissioner of Patents and Trademarks